US 011102901B2

(12) United States Patent
Lostoski et al.

(10) Patent No.: US 11,102,901 B2
(45) Date of Patent: *Aug. 24, 2021

(54) ELECTRONICS MODULE MOUNTING SYSTEM

(71) Applicant: Rockwell Automation Technologies, Inc., Mayfield Heights, OH (US)

(72) Inventors: Douglas A. Lostoski, Richfield, OH (US); Adam M. Wrobel, Gates Mills, OH (US); Michael S. Baran, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/824,273

(22) Filed: Mar. 19, 2020

(65) Prior Publication Data

US 2020/0221597 A1 Jul. 9, 2020

Related U.S. Application Data

(63) Continuation of application No. 16/147,556, filed on Sep. 28, 2018, now Pat. No. 10,631,426.

(51) Int. Cl.
*H05K 7/14* (2006.01)
*H05K 1/02* (2006.01)

(52) U.S. Cl.
CPC ......... *H05K 7/1417* (2013.01); *H05K 1/0215* (2013.01); *H05K 7/1474* (2013.01)

(58) Field of Classification Search
CPC ... H05K 7/1417; H05K 7/1474; H05K 1/0215
See application file for complete search history.

(56) References Cited

U.S. PATENT DOCUMENTS

| 6,418,027 B1 | 7/2002 | Suzuki et al. |
| 7,042,731 B2 | 5/2006 | Schneeberger |

(Continued)

FOREIGN PATENT DOCUMENTS

| CN | 204732593 U | 10/2015 |
| CN | 207320446 U | 5/2018 |

(Continued)

OTHER PUBLICATIONS

Siemens's Pamphlet titled *SIMATIC ET 200SP Distributed I/O system, System Manual*, Feb. 2018, A5E03576849-AH, pp. 70, 72, 74, 76, 77, 78 and 80.

(Continued)

*Primary Examiner* — Hung S. Bui
*Assistant Examiner* — Sagar Shrestha
(74) *Attorney, Agent, or Firm* — Fay Sharpe LLP

(57) ABSTRACT

An electronics module mounting system includes a baseplate with a main wall, opposite left and right ends spaced apart from each other along an X axis, and opposite first and second spaced-apart edges extending between the left and right ends. The first and second edges are spaced apart along a Y axis. The baseplate includes a first channel that projects outwardly from the main wall and includes a mounting leg that projects outwardly from the main wall and that forms a mounting recess. A module mounting base is connected to the baseplate and includes a mounting tab located in the mounting recess. The mounting base includes a front face to receive and retain an electronics module and a rear face located opposite the front face. A channel recess is located in the rear face and extends between opposite left and right edges of the mounting base. The channel of the baseplate is located in the channel recess. The mounting base includes first and second electrical connectors that are aligned with each other and aligned with the channel recess. A fastener (Continued)

extends through the mounting base at a location aligned with the channel recess such that the fastener is engaged with the channel of the baseplate.

17 Claims, 7 Drawing Sheets

(56) References Cited

U.S. PATENT DOCUMENTS

| | | | |
|---|---|---|---|
| 7,059,898 | B2 | 6/2006 | Barile |
| 7,980,891 | B2 | 7/2011 | Molnar |
| 8,066,239 | B2 | 11/2011 | Molnar et al. |
| 9,374,924 | B2 * | 6/2016 | Boretti ................. H05K 7/1474 |
| 9,743,538 | B2 * | 8/2017 | Mickmann ........... H05K 5/0021 |
| 9,967,995 | B2 | 5/2018 | Molnar et al. |
| 2004/0165357 | A1 | 8/2004 | Schneeberger |
| 2011/0269339 | A1 | 11/2011 | Baran |
| 2013/0100605 | A1 | 4/2013 | Horii |
| 2014/0092577 | A1 * | 4/2014 | Murata ............... B29C 48/0011 361/809 |
| 2015/0214657 | A1 * | 7/2015 | Geitner .............. H01R 13/6272 439/357 |
| 2015/0349523 | A1 * | 12/2015 | Tsovilis ................. H01C 13/02 361/56 |
| 2016/0093973 | A1 * | 3/2016 | Hirano ................... H01R 13/60 439/284 |
| 2017/0055363 | A1 * | 2/2017 | Ankarbjork ............ F16M 13/02 |
| 2017/0171960 | A1 * | 6/2017 | Yang .................... H04M 1/0277 |
| 2018/0324963 | A1 * | 11/2018 | Walti ................... H02B 1/0526 |
| 2019/0045649 | A1 * | 2/2019 | Schweizer ........... H02B 1/0523 |

FOREIGN PATENT DOCUMENTS

| | | |
|---|---|---|
| DE | 196 10 559 A1 | 9/1997 |
| DE | 101 48 470 A1 | 4/2003 |
| DE | 10 2015 104 044 A1 | 9/2016 |
| EP | 1 524 890 A1 | 4/2005 |

OTHER PUBLICATIONS

Siemens's Pamphlet titled *SIMATIC S7-1500 Getting Started*, May 2014, A5E03981761-AC, pp. 17, 18 and 19.

Siemens's Pamphlet titled *SIMATIC S7-1500, S7-1500 Automation System, System Manual*, Jan. 2013, A5E03461182-01, pp. 14, 15, 41, 42, 43, 44, 45, 46, 47, 48, 49, 50, 51, 52, 175, 176, 177, 178, 180 and 191.

Extended European Search Report, EP Application No. 19198963.1 dated Feb. 18, 2020, 6 pages.

First Office Action dated Sep. 3, 2020 issued by China National Intellectual Property Administration for Application No. 201910899809.5 (with English explanation).

Second Office Action dated Jan. 15, 2021 issued by China National Intellectual Property Administration for Application No. 201910899809.5 (with English explanation).

* cited by examiner

ELECTRONICS MODULE MOUNTING SYSTEM

CROSS REFERENCE TO RELATED APPLICATION

This application is a continuation of co-pending U.S. application Ser. No. 16/147,556 filed Sep. 28, 2018, and the entire disclosure of said prior application is hereby expressly incorporated by reference into the present specification.

BACKGROUND OF THE INVENTION

Systems for mounting electronics modules for industrial automation and other applications are well-known and in widespread use. In one typical known example, a DIN rail is secured to a mounting structure, and the electronics modules are secured to the DIN rail, either directly or through a mounting base that is, itself, first secured to the DIN rail. Typically, the modules are mechanically interconnected in series to form a system. The modules are also typically electrically connected to the adjacent upstream and/or downstream module through a backplane connector system that establishes a backplane circuit for electronic data and electrical power. The backplane circuit can be established through the module bases and/or through the modules that are connected to the module bases.

While known DIN rail mounting systems are generally acceptable, a need has been identified for a new and improved electronics module mounting system that overcomes certain known disadvantages and drawbacks. For example, certain known systems require a user to install the electronics module in its operative position by manually positioning the module in space with six degrees of freedom being present along three perpendicular X, Y, Z axes (left/right along the X axis, up/down along the Y axis, forward (in)/back (out) along the Z axis) and also to orient the module manually in space with the correct pitch, yaw, and roll. Certain known systems provide a guide structure for guiding each modules into its proper installed operative position, but these guide structures have been found to be suboptimal in that they are difficult to use in certain confined spaces or other situations, and the guide structures or parts of the module (such as a backplane connector) can be easily damaged during the module installation process if the electronics module is misaligned in any way.

Additionally, modern electronics modules for industrial automation or other applications are required to implement high-frequency and complex data communications protocols for transmitting data along the backplane created when the modules are physically and electrically interconnected. These high-speed complex backplane circuits require that the backplane connectors of the electronics modules be complex with multiple pins, contacts, and other structures that must be precisely aligned and mated to prevent interference and other communications errors. These connectors are complex and are susceptible to damage during module installation if the module being installed is not properly aligned during the installation process.

Also, the electronics modules are often subjected to harsh conditions including vibrations and other physical forces that tend to move the module relative to its mounting base, relative to the DIN rail, and relative to adjacent modules. These module movements can disrupt the backplane communications circuit due to relative movement between mated connector portions of adjacent modules. These movements can also cause a module to become at least partially dislodged from its installed operative position, especially for larger, heavy modules where the module mounting system is inadequate to operative secure the module in its operative position.

Another drawback with known module mounting systems is that the end-user sometimes must perform multiple steps to secure the module in its operative position and/or to establish a reliable ground connection between the module and the DIN rail or other mounting structure. It is desirable to reduce the number of steps required for module installation (and removal) and for establishing a proper electrical ground path.

Also, it is desirable to provide a mounting system that facilitates installation of accessories adjacent to the installed module(s). Many known systems fail to provide a convenient and effective accessory mounting location for known accessories such as additional system ground connectors, cable shield ground connectors, jumper connectors, cable holders, and the like.

For the above reasons and others, a need has been identified for a new and improved electronics module mounting system that overcomes the above disadvantages and drawbacks of known systems while providing better overall results.

SUMMARY OF THE INVENTION

In accordance with one aspect of the present development, an electronics module mounting system includes a baseplate with a main wall comprising opposite first and second faces and opposite left and right ends that are spaced apart from each other along an X axis. The baseplate also includes opposite first and second spaced-apart edges that extend between and interconnect the left and right ends, and the first and second edges are spaced apart from each other along a Y axis. A first channel projects outwardly relative to the first face of the main wall. A mounting leg that projects outwardly relative to the first face of the main wall and is arranged relative to said first face such that a mounting recess is defined between the mounting leg and the first face, and the mounting leg is spaced-apart from the first edge of the baseplate. A module mounting base is connected to the baseplate and includes at least one mounting tab that projects outwardly from the mounting base, and the mounting tab is located in the mounting recess of the baseplate. A front face of the module mounting base is adapted to receive and retain an associated electronics module, and a rear face is located opposite the front face and lies adjacent the first face of the baseplate main wall. The rear face of the mounting base includes a channel recess located therein that extends between opposite left and right edges of the mounting base, wherein the first channel is located in the channel recess. A first electrical connector is located adjacent the left edge of the mounting base and a second electrical connector is located adjacent the right edge of the mounting base. The first and second electrical connectors are aligned with each other and a Y axis position of each of the first and second connectors at least partially overlaps a Y axis position of the channel recess. At least one fastener extends through the first mounting base and intersects the channel recess, the at least one fastener is engaged with the first channel of said baseplate.

In accordance with another aspect of the present development, an electronics module mounting system includes a baseplate and first and second module mounting bases connected to the baseplate. The baseplate includes a main wall comprising opposite first and second faces and opposite left and right ends that are spaced apart from each other along an X axis. The baseplate also includes opposite first and second spaced-apart edges that extend between and interconnect the left and right ends, and the first and second edges are spaced apart from each other along a Y axis. A first channel projects outwardly relative to the first face of the main wall. A mounting leg that projects outwardly relative to the first face of the main wall and is arranged relative to said first face such that a mounting recess is defined between the mounting leg and the first face, and the mounting leg is spaced-apart from the first edge of the baseplate. The first and second module mounting bases connected to the baseplate each include at least one mounting tab that projects outwardly from the mounting base, and the mounting tab is located in the mounting recess of the baseplate. A front face of the module mounting base is adapted to receive and retain an associated electronics module, and a rear face is located opposite the front face and lies adjacent the first face of the baseplate main wall. The rear face of the mounting base includes a channel recess located therein that extends between opposite left and right edges of the mounting base, wherein the first channel is located in the channel recess. A first electrical connector is located adjacent the left edge of the mounting base and a second electrical connector is located adjacent the right edge of the mounting base. The first and second electrical connectors are aligned with each other and a Y axis position of each of the first and second connectors at least partially overlaps a Y axis position of the channel recess. At least one fastener extends through the channel recess and is engaged with the first channel of said baseplate. The first mounting base includes one of a stud and a slot adjacent the right edge of the first mounting base and the second mounting base includes the other of said stud and said slot adjacent the left edge of the second mounting base, and the stud of one base is located in the slot of the other base and is captured in the slot with respect to movement along said X axis such that the first and second mounting bases are restrained against movement relative to each other along the X axis. The first connector of the second mounting base is mechanically and electrically mated with the second connector of the first mounting base such that the mated first and second connectors are restrained against movement relative to each other along both said X axis and said Y axis.

In accordance with a further aspect of the present development, a method of installing an electronics module mounting base includes providing a base plate that includes a main wall comprising opposite first and second faces and opposite left and right ends that are spaced apart from each other along an X axis. The baseplate also includes opposite first and second spaced-apart edges that extend between and interconnect the left and right ends, and the first and second edges spaced apart from each other along a Y axis. A first channel projects outwardly relative to the first face of the main wall. A mounting leg projects outwardly relative to the first face of the main wall, and the mounting leg is arranged relative to the first face such that a mounting recess is defined between the mounting leg and the first face, wherein the mounting leg spaced-apart from the first edge of the baseplate. The first module mounting base is connected to the baseplate. The second module mounting base is connected to the baseplate adjacent the first module mounting base, and both the first and second module mounting bases comprise a front face adapted to receive and retain at least one electronics module. The step of connecting the second module mounting base to the baseplate includes inserting a mounting tab of the second module mounting base into the mounting recess of the baseplate and pivoting the second module mounting base relative to the first module mounting base about a pivot axis located in the mounting recess toward the baseplate so that a stud projecting outwardly from one of the first and second mounting bases is received in a slot formed in the other of the first and second mounting bases. The second module mounting base is further pivoted relative to the first mounting base about the pivot axis toward said baseplate until: (i) a rear face of the second mounting base is abutted with the baseplate; (ii) the first channel of the baseplate is received in a channel recess located in the rear face of the second mounting base; and (iii) a first electrical connector of said second module mounting base is physically and electrically mated with a second electrical connector of the first mounting base such that the first and second electrical connectors restrain said first and second mounting bases and said first and second electrical connectors from moving relative to each other along the X axis and along the Y axis.

DETAILED DESCRIPTION

Figure 1:
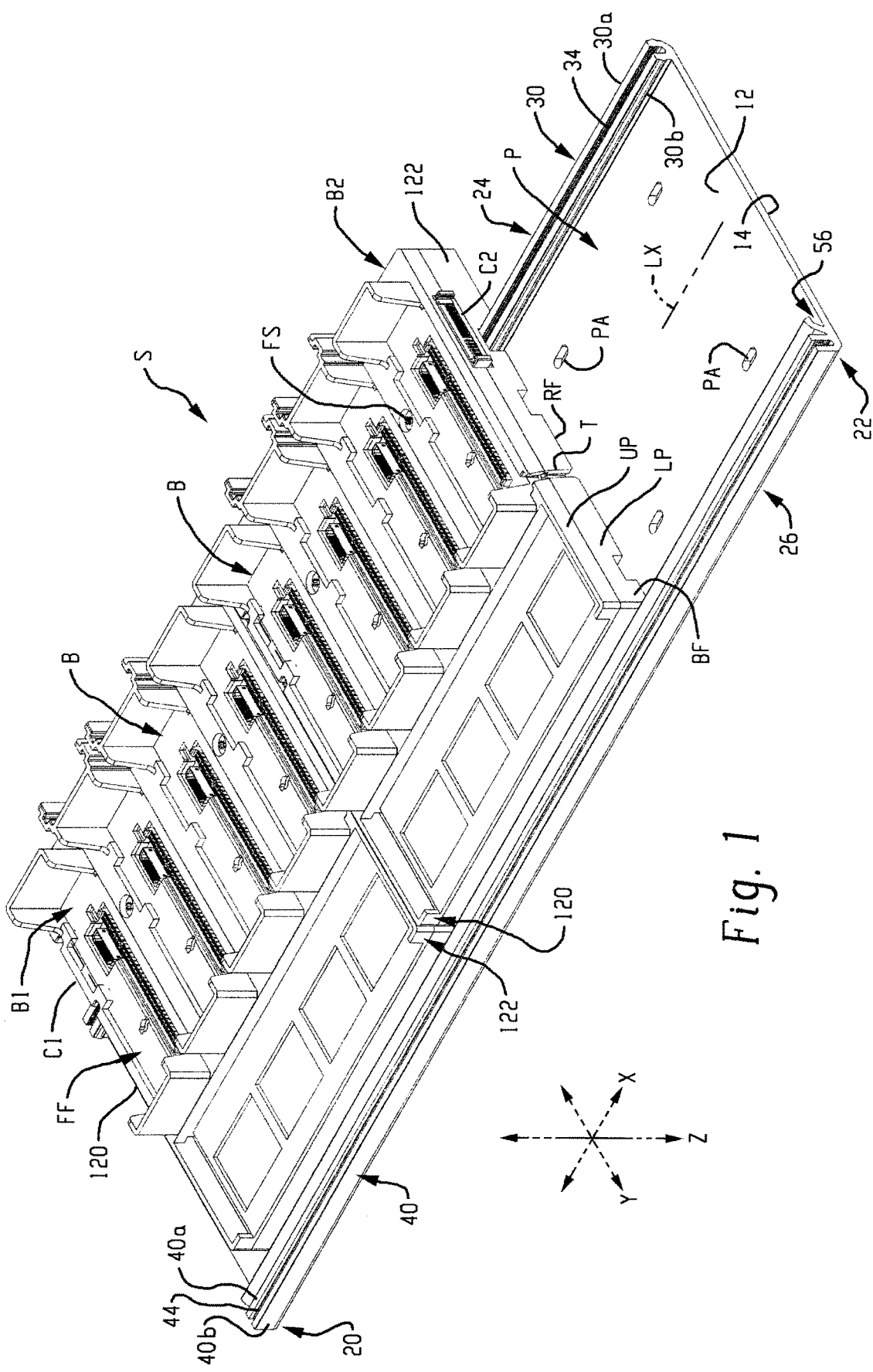
FIG. 1 provides an isometric view of an electronics module mounting system according to an embodiment of the present development, including a baseplate and first and second module mounting bases connected thereto.

FIG. 1 shows an electronics module mounting system S according to an embodiment of the present development. The system S includes a baseplate P and at least one but typically a plurality of module mounting bases B such as the illustrated first and second mounting bases B1,B2 operatively connected thereto. The baseplate P is adapted to be secured to an associated mounting structure such as a cabinet, wall, machine, rack, or the like and thus includes a plurality of mounting apertures PA that extend there through and that are adapted to receive screws or other fasteners for mounting the baseplate.

Figure 2:
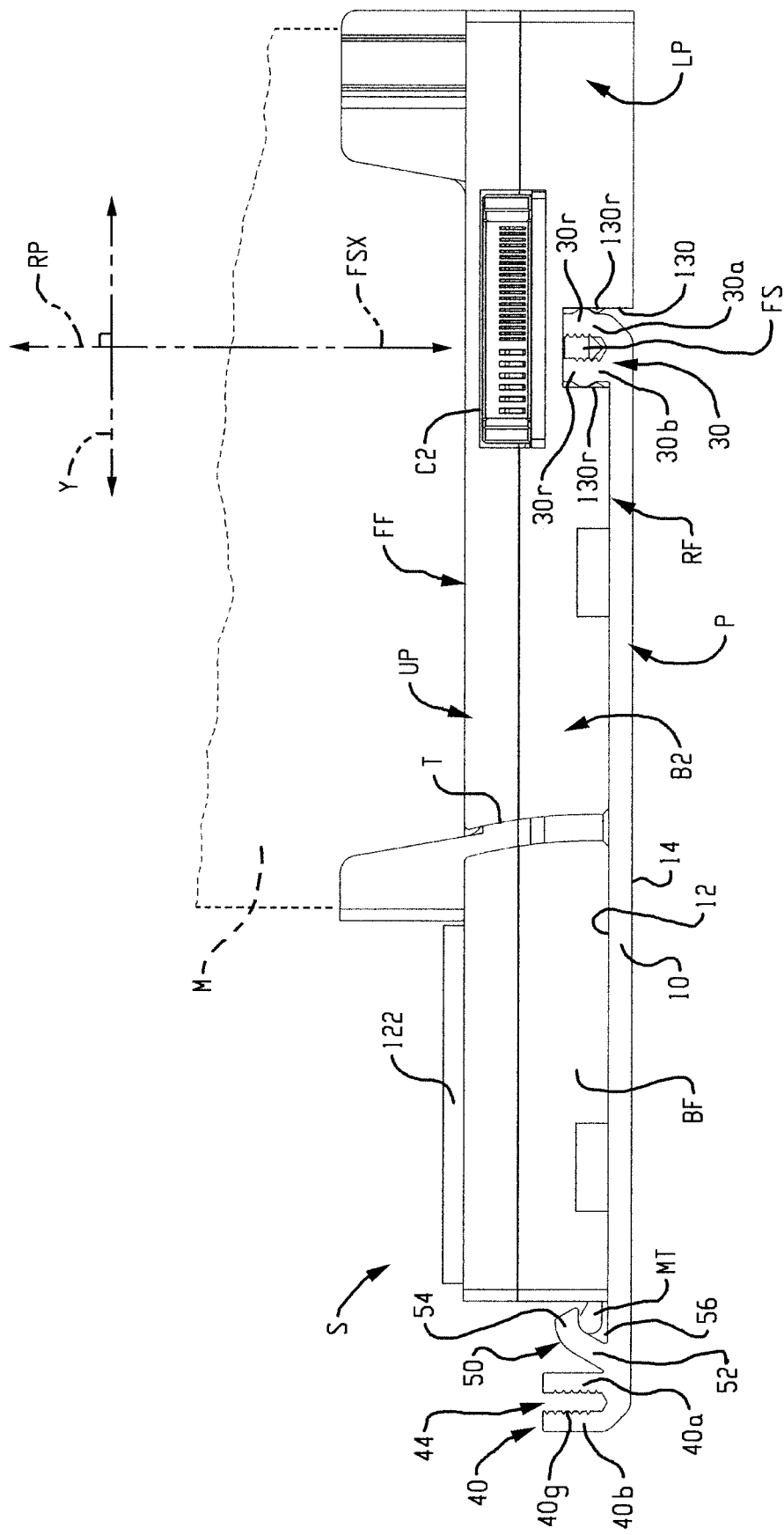
FIG. 2 is a right side view of the system of FIG. 1, and also shows an associated electronics module operatively connected to one of the mounting bases (the electronics module is shown in broken lines)

FIG. 2 is a right side view of the system of FIG. 1, and also shows an associated electronics module M operatively connected to the second mounting base B2 (the electronics module is shown in broken lines). The associated electronics module M may be any of a wide variety of different electronics modules such as a controller module, a power supply module, a communications module, an input/output module, or any other module that includes one or more electronic components therein, and it is not intended that the system S be limited to any particular type of module M or module function.

Figure 3:
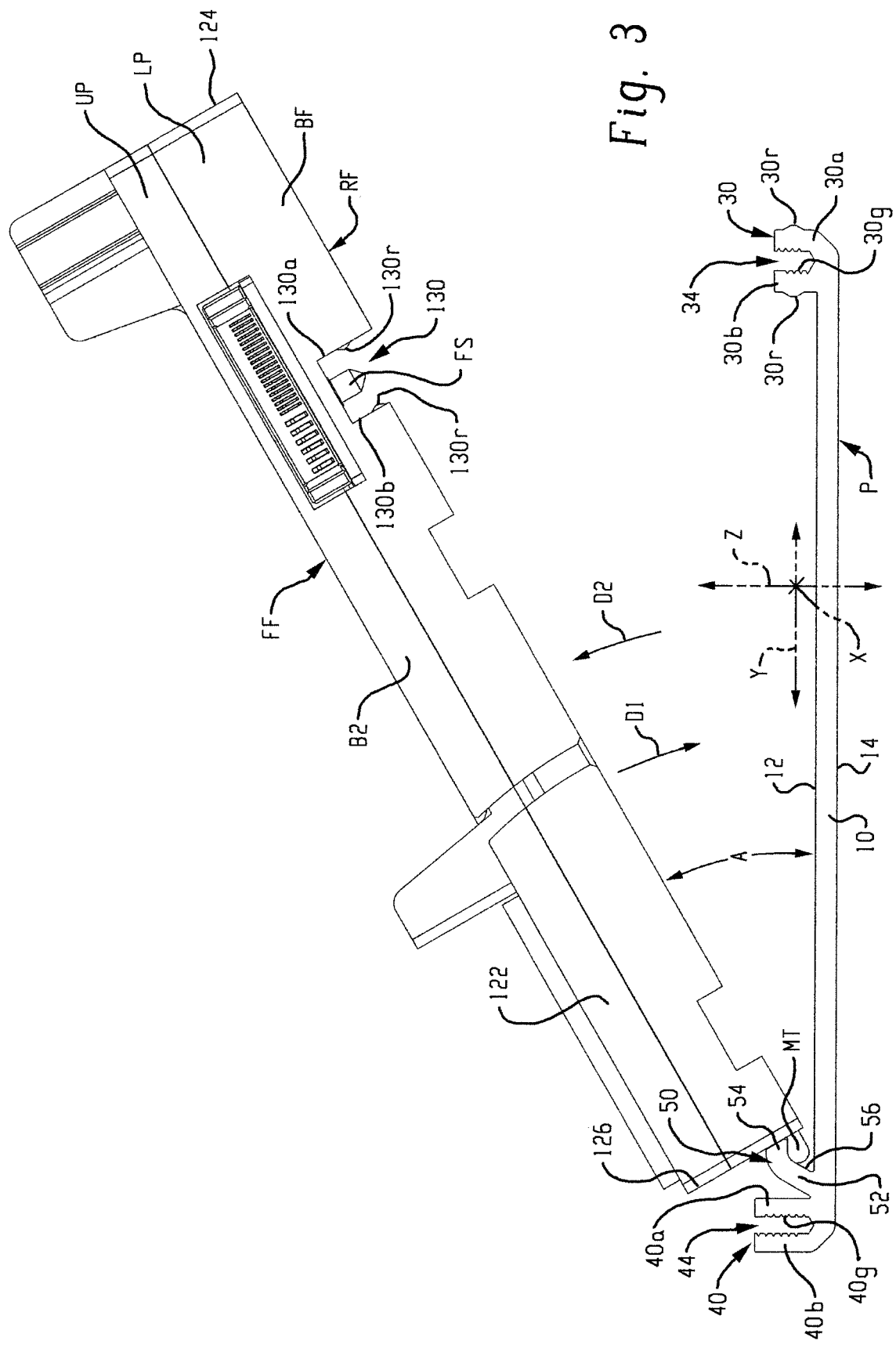
FIG. 3 is similar to FIG. 2 but shows only a first one of the mounting bases in a partially installed (or partially uninstalled) position relative to the baseplate.

In the illustrated embodiment, the baseplate P preferably comprises a one-piece metallic electrically conductive structure such as extruded aluminum or the like. The baseplate P can alternatively comprise a multi-piece structure including multiple metal and/or polymeric structures that are interconnected to form the baseplate P. As shown herein, the baseplate comprises a one-piece extruded aluminum structure having an extrusion profile as shown in FIGS. 2 and 3. The baseplate P can alternatively be manufactured using any other suitable material such as a metal and/or polymeric material and/or using any suitable technique such as extrusion, injection or other molding/forming processes, machining, stamping or other metal forming techniques, additive manufacturing techniques such as 3-D printing, or any other suitable polymeric or metal manufacturing materials and techniques.

The baseplate P comprises a main wall 10 that includes a first or front face 12 and an opposite second or rear faces 14. The plurality of mounting apertures PA extend through the main wall 10 and are adapted to receive screws or other fasteners for mounting the baseplate P to an associated support structure with its rear face 14 abutted with the support structure and its front face 12 facing outwardly away from the support structure.

The baseplate P can have any desired length between its opposite left and right ends 20,22. The baseplate further includes a first (upper) longitudinally extending edge 24 and a second (lower) longitudinally edge 26. The first and second edges 24,26 are arranged parallel relative to each other and relative to a longitudinal axis (or extrusion axis) LX of the baseplate P. The first and second edges 24,26 are spaced-apart relative to each other and they each extend between and interconnect the opposite left and right ends 20,22 of the base plate P. The baseplate P can be mounted on the associated support structure in any desired orientation, but is described herein with the first edge 24 being located vertically above the second edge 26 such that the first edge 24 can be referred to as an upper edge and the second edge 26 can be referred to as a lower edge.

Referring also to FIG. 3, the baseplate P comprises a first channel 30 projects outwardly relative to the front face 12 and that extends along its full length between the left and right ends 20,22. The first channel 30 comprises first and second spaced-apart side walls 30a,30b that project outwardly away from the main wall 10 and that extend parallel the longitudinal axis LX. A first open slot 34 (FIG. 3) is defined between the side walls 30a,30b. The opposed inner faces of the side walls 30a,30b optionally include longitudinally extending ribs and/or grooves 30g that facilitate threaded engagement of a screw in the slot 34. The first channel 30 is located closer to the first edge 24 as compared to the second edge 26. As shown herein, the first channel 30 is located adjacent the first edge 24 with the first side wall 30a thereof defining the first edge 24, but the first channel 30 can alternatively be spaced inwardly away from the first edge 24 closer to the second edge 26.

Either one or both of the side walls 30a,30b of the first channel 30 optionally comprises a longitudinally extending rib 30r on an outer face that is oriented away from the other side wall 30a,30b, i.e., on the side located opposite and outside of the open slot 34. As described in further detail below, the ribs 30r are engaged by a corresponding mating rib, nib, or other projection 130r (see FIGS. 2 & 3) of a module mounting base B that is connected to the baseplate P to provide a snap-fit retention feature for the module mounting base B. The snap-fit engagement of the ribs 30r,130r also provides a tactile feedback to a user when the mounting base B is installed on the baseplate as described below to indicate to the user when the module mounting base B is fully operatively installed on the baseplate P.

Similarly, the illustrated baseplate P further comprises an optional second channel 40 that extends along its full length between the left and right ends 20,22. The second channel 40 is similar to the first channel 30 and comprises first and second spaced-apart side walls 40a,40b that project outwardly away from the main wall 10 and that extend parallel the longitudinal axis LX. An open slot 44 is defined between the side walls 40a,40b. The opposed inner faces of the side walls 40a,40b optionally include longitudinally extending ribs and/or grooves 40g that facilitate threaded engagement of a screw in the slot 44. As shown herein, the second channel 40 is located adjacent the second edge 26 with the second side wall 40b thereof defining the second edge 26, but the second channel 40 can alternatively be spaced inwardly away from the second edge 26 closer to the first edge 24. The second channel provides a location for mounting any desired associated structure to the baseplate P using a screw or other fastener that is engaged in the open slot 44. For example, an accessory such as a cable shield ground, a cable clamp/guide/support, a label holder or other indicia, or any other desired accessory can be fixedly secured to the baseplate P in any desired location along the X axis using a fastener that is threadably or otherwise mated with the slot 44 of the second channel 40.

The baseplate P further comprises a mounting hook 50 that projects outwardly from the front face 12 of the main wall 10. The mounting hook 50 is located closer to the second edge 26 as compared to the first edge 24 and extends parallel to the longitudinal axis LX completely between the left and right ends 20,22. In the illustrated embodiment, the hook 50 is situated between the first and second channels 30,40 and is located adjacent the second edge 26 and adjacent the second channel 40. The mounting hook 50 comprises a mounting leg 52 that projects outwardly from and/or relative to the front face 12 of the main wall 10 and that extends outwardly to an outer end 54. At least part of the mounting leg 52 is curved and/or angled and/or otherwise arranged relative to the main wall 10 toward the first edge 24 of the baseplate P such that an open mounting slot or mounting recess 56 is defined between at least the outer end 54 of the mounting leg 52 and the front face 12 of the main wall 10. The mounting recess opens toward the first edge 24 of the baseplate P. The recess 56 is open between the leg outer end 54 and the main wall 10 and is adapted to receive and retain a mating tab MT of a mounting base B therein as described in further detail below.

The connection of the module mounting bases B to the baseplate P are described herein with reference to a 3-dimensional space defined by an X axis that lies in the plane of the main wall 10 of the baseplate P and that extends parallel to the longitudinal axis, a Y axis that lies in the plane of the main wall 10 of the baseplate P and that is oriented perpendicularly relative to the X axis, and a Z axis that is oriented perpendicularly relative to both the X axis and the Y axis. As described below, the present module mounting system S described herein locates the a module mounting base B on the baseplate P in a manner that successively eliminates movement of the module mounting base along these three axes such that degrees of freedom of movement of the module mounting base are progressively eliminated until the module mounting base B is operatively positioned on the baseplate P and is fixed in position with respect to all three axes X,Y,Z.

Although the mounting bases B (B1,B2) can vary relative to each other in terms of the type of module M that can be mated therewith and in terms of the structure and operation of certain features of the mounting base B, the different mounting bases B each include a lower portion LP formed in accordance with the present development and comprising a body or frame BF that includes mounting features as described herein that allow for each mounting base B to be operatively mounted on the baseplate P as described herein. Each mounting base B further comprises an upper portion UP that is connected to the lower portion LP and that is adapted to receive various electronics modules M, wiring terminal blocks, and other components of the system S.

Each mounting base B further includes first and second electrical connectors C1,C2 connected to the lower portion LP and/or upper portion UP that allow adjacent mounting bases B (B1,B2) to be physically and electrically operatively interconnected to construct a backplane data/power transmission circuit BK (FIG. 1) that travels through the successively interconnected adjacent mounting bases B. These connectors C1,C2 are described in further detail below.

The mounting bases B each further comprise left and right lateral edges 120,122 located on opposite lateral sides or edges of the body BF, and also each include a first or upper edge 124 and a second or lower edge 126 located on opposite first and second sides of the body BF. The first and second mounting base edges 124,126 are arranged parallel and spaced-apart from each other and each extend between and interconnect the left and right edges 120,122. Each mounting base B further includes a rear face RF that is oriented toward the baseplate P when the mounting base B is operatively installed on the baseplate P and a front face FF that is located opposite the rear face RF and that is oriented away from the baseplate P when the mounting base B is operatively installed on the baseplate P. The front face FF is configured to mate with the associated electronics module M and other associated components.

Figure 5:
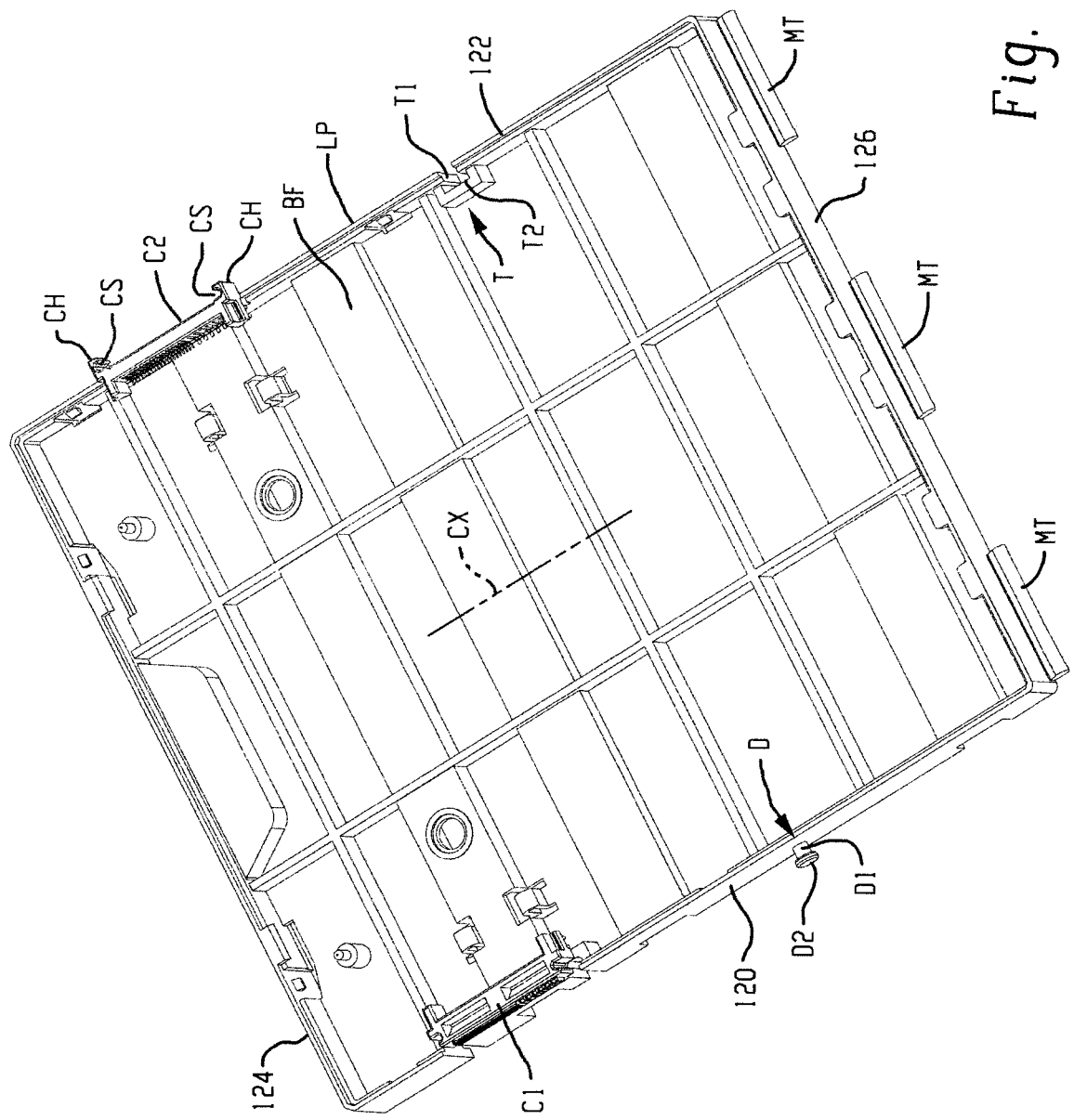
FIG. 5 is an isometric view of a mounting base frame formed in accordance with an embodiment of the present development.
Figure 6:
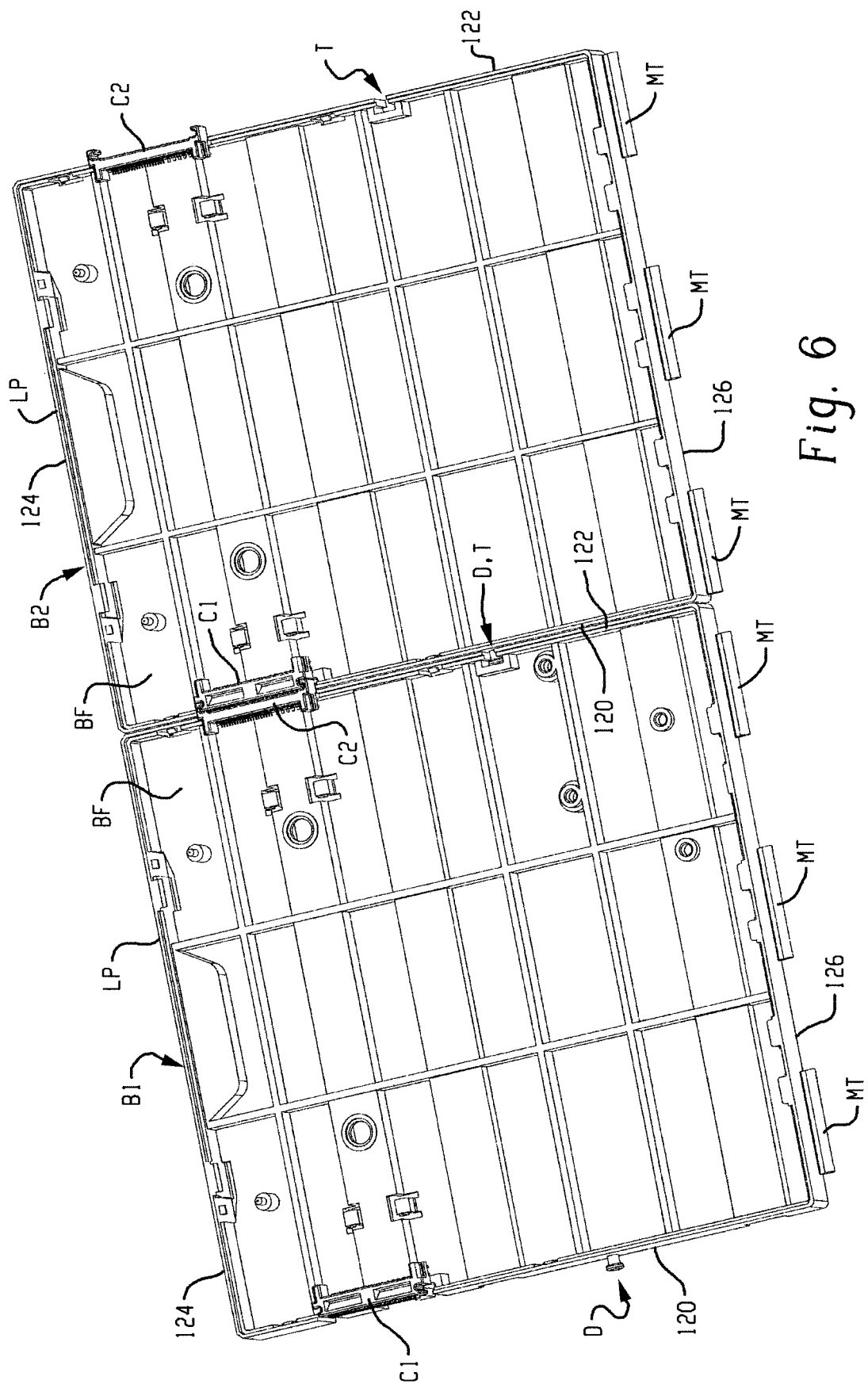
FIG. 6 is an isometric view that partially illustrates the mounting base frame of FIG. 5 operatively mated with a second mounting base frame according to an embodiment of the present development.

Each mounting base B comprises a least one mounting tab MT that projects outwardly therefrom and that is adapted to be received in the mounting recess 56 of the baseplate P. As shown in FIGS. 5 & 6, the frame BF of each mounting base B of the illustrated embodiment includes a plurality of separate, evenly spaced-apart mounting tabs MT, wherein at least part of a mounting tab MT is located between a central axis CX of the frame and the left lateral edge 120 and at least part of the same or a different mounting tab MT is located between the central axis CX and the right lateral edge 122. Providing at least part of a mounting tab MT on both opposite lateral sides of the central axis CX ensures that the mounting base B is properly engaged with the baseplate P as described below. Alternatively, the mounting tab MT is provided by a single, continuous projection that preferably extends across the central axis CX.

As shown in FIG. 3, each mounting tab MT is adapted to be received and retained in the mounting recess 56 defined between the mounting hook 50 and the main wall 10 of the baseplate P when the mounting base B is located in a first installation position such that the frame BF of the mounting base B defines an acute angle A between itself and the main wall 10 of the baseplate P and having its vertex located in the mounting recess 56. Each mounting tab MT includes a curved outer surface that corresponds to a curved inner surface defined by the hook 50 and located in the mounting recess 56 so that the mounting base B is pivotable in first and second directions D1,D2 relative to the baseplate P when the mounting tab MT is seated in the mounting recess 56.

It should be recognized that when the mounting tab MT is fully seated in the mounting recess 56 as shown in FIG. 3, the position of the module mounting base B on the Y axis is determined and finalized. Accordingly, when the mounting tab MT is fully seated in the mounting recess 56, the module mounting base B is properly located on the Y axis but can still be slid in the mounting groove 56 along the X axis and also rotated in the Y-Z plane in the first and second directions D1,D2.

Figure 4:
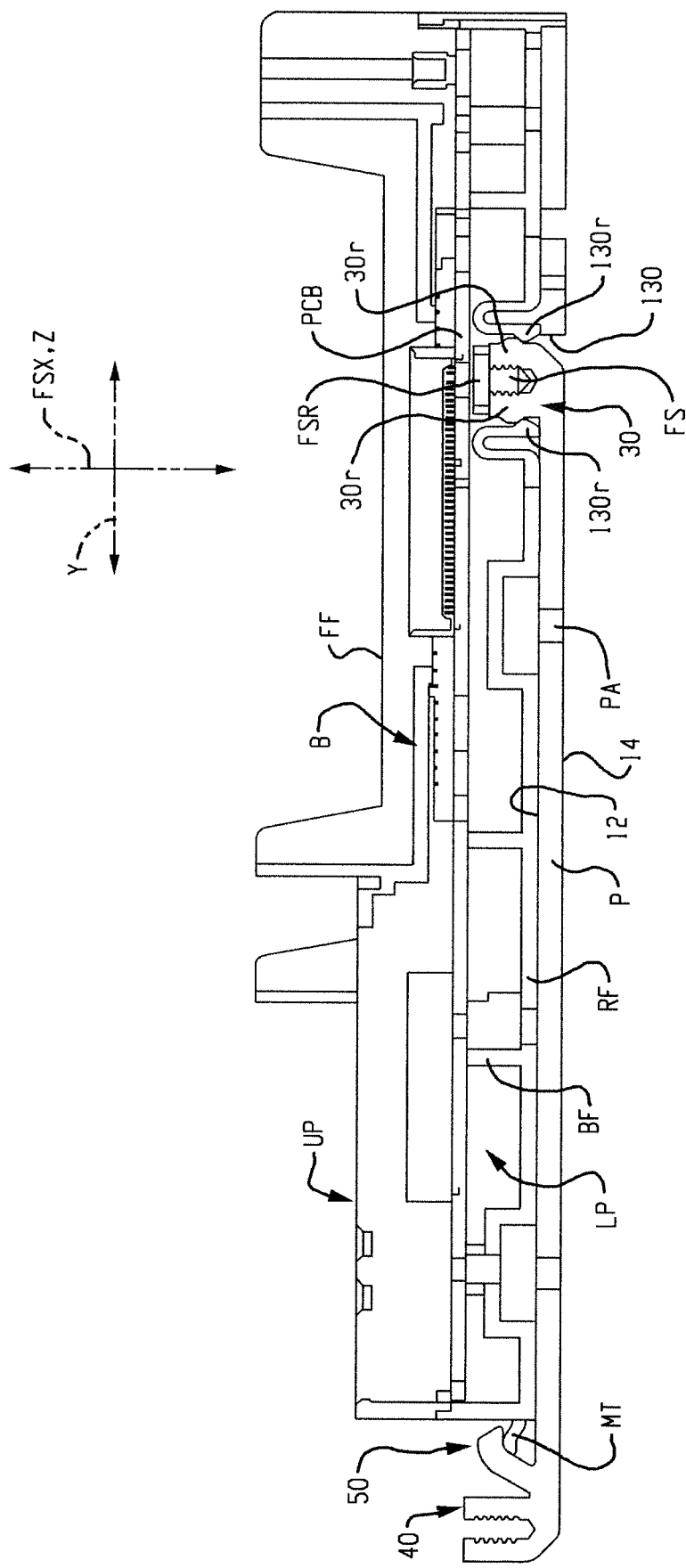
FIG. 4 is a section view that shows the alignment and operative securement of the mounting base to the baseplate using a screw that also establishes a ground path between a printed circuit board (PCB) of the mounting base and the baseplate.

Each mounting base B further comprises a channel recess 130 that is located on the rear face RF at a located spaced-apart from the mounting tab(s) MT and that extends continuously between the left and right edges 120,122 of the mounting base B. As shown in FIG. 2, the channel recess 130 is adapted to receive the first channel 30 of the baseplate P with minimal clearance when the mounting base B is operatively secured to the baseplate P. As noted above, either one or both of the side walls 30a,30b of the first channel 30 optionally comprises a longitudinally extending rib 30r on an outer face that is oriented away from the other side wall 30a,30b, i.e., on the side located outside the open slot 34. As shown in FIG. 4, each module mounting base B preferably includes one or more molded polymeric resilient clips 130r that engage the corresponding ribs 30r of the baseplate first channel 30 with a snap-fit when the first channel 30 is fully received in the channel recess 130 to provide a retention feature for the module mounting base B relative to the baseplate P. The snap-fit engagement of the ribs 30r and clips 130r also provides a tactile feedback to a user when the mounting base B is installed on the baseplate P as described below to indicate to the user when the module mounting base B is fully operatively installed on the baseplate P.

As shown in FIG. 3, to install a mounting base B on the baseplate P, the mounting base B is moved to the installation position, and the mounting tabs MT of the mounting base B are fully inserted into mounting recess 56. The mounting base B is then pivoted in the first (installation) direction D1 in the Y-Z plane until the first channel 30 of the baseplate P is fully seated in the channel recess 130 (see FIG. 2), with the projections 130r in the channel recess 130 being fully engaged with a corresponding projection 30r of the baseplate first channel 30 with a snap-fit. As noted, the first channel 30 of the baseplate P fits in the channel recess 130 of the mounting base B with minimal clearance between the channel legs 30a,30b and the adjacent side walls 130a,130b of the mounting base B that define the channel recess 130 such that the mounting base B is substantially immovable in either direction along the Y axis. When the first channel 30 of the baseplate P is fully seated in the channel recess 130 of the mounting base B, the mounting base B is removably retained on the baseplate P by the engaged projections 130r,30r and movement of the mounting base B in either direction on the Y axis is prevented by the mounting tab(s) MT being engaged in the mounting recess 56 and by the first channel 30 of the baseplate P being seated and closely received in the channel recess 130 of the mounting base B. Likewise, when the mounting base B is pivoted fully in the installation direction D1 until the baseplate first channel 30 is completely seated in the channel recess 130, the rear face RF of the mounting base B is abutted with the main wall 10 of the baseplate P and the position of the mounting base B along the Z axis is also determined and fixed.

The mounting base B further comprises at least one or a plurality of fasteners FS as shown herein, with the number of fasteners being variable depending upon the size of the mounting base B and the weight of the modules M to be connected thereto. Each fastener FS extends through the front and rear faces FF,RF of the mounting base B and is oriented with its head accessible adjacent the front face and its shank projecting outwardly from the rear face RF. Each fastener FS extends along and rotates about a fastener axis FSX that is coincident with or parallel to the Z axis and that intersects the channel recess 130. As shown herein, the fasteners FS comprise fastening screws with a threaded shank. Each fastener FS is preferably captured to the mounting base B. As shown in FIG. 2, when the mounting base B is installed in its operative position on the baseplate P, each fastener FS is advanced into and threadably or otherwise engaged with the open slot 34 of the first channel 30 to fixedly secure the mounting base B to the baseplate P. The illustrated fastener FS engages the slot 34 of the first channel 30 with a threaded engagement, but can alternatively engage the slot 34 with a latch connection such as a quarter-turn latch, a snap-fit, a friction-fit or any other suitable mechanical engagement.

As noted above, the side walls 30a,30b including optional ribs or grooves 30g for engagement with the threads or other part of the fastener FS. Referring also to FIG. 4, when the fastener FS is engaged with the baseplate P, it provides an electrical ground path between the mounting base B and the baseplate P which is, itself connected to a chassis ground or other ground path. In the illustrated embodiment, a metal ring FSR is coaxially positioned about each fastener FS and is compressed or captured between a printed circuit board PCB and the first channel 30 of the baseplate P to electrically connect the printed circuit board PCB to the baseplate P to provide the required ground path.

Referring now also to FIGS. 5 and 6, the mounting bases B each include structures for fixing the position of first and second mounting bases B1,B2 relative to each other along the X axis when the mounting bases B are operatively secured to the baseplate P. In particular, each mounting base B comprises a projecting stud D and a slot T, located on the opposite first and second lateral edges 120,122 thereof. One of the first and second lateral edges 120,122 comprises the projecting stud D (the first edge 120 in the illustrated embodiment) and the other of the first and second lateral edges 120,122 comprises the slot T (the second edge 122 in the illustrated embodiment). The stud D and slot T are aligned with each other between the upper and lower edges 124,126, and they are dimensioned and shaped such that the stud D is receivable in the slot T when first and second mounting bases are connected in succession to the baseplate P.

More particularly, the stud D includes a shank D1 that extends perpendicularly relative to the central axis CX. Each stud D also includes an enlarged head D2 located at the outer end of the shank D1 spaced from the mounting base left edge 120. Each slot T includes a narrow first portion T1 that is adapted to receive the shank D1 of the stud D and a wider second portion T2 that is adapted to receive the enlarged head D2 of the stud. The enlarged head D2 of the stud D does not fit through the narrow first portion T1 of the slot T. In the illustrated embodiment in which the slot T is located on the second lateral edge 122 of the mounting base B, the first and second portions T1,T2 of the slot open through the front face FF of a first installed "upstream" mounting base B (shown herein as the mounting base B1) such that the stud D projecting outwardly from the first lateral edge 120 of an adjacent second "downstream" mounting base B (shown herein as the mounting base B2) is slidably received into the slot T through the opening in the front face FF when the downstream mounting base B2 is pivoted into its operative position in the installation direction D1 so as to lie adjacent to the previously installed upstream mounting base B1. The enlarged head D2 of the stud D is captured in the slot T with respect to lateral movement along the X axis of the system S which connects or captures the first and second mounting bases B1,B2 together with respect to X axis movement so that cannot be pulled apart from each other. If the positions of the stud D and slot T are reversed, the slot T will open through the rear face FR of the downstream mounting base B in order to receive the stud D of a previously installed upstream mounting base B. In either case the slot T is located so as to receive the stud D when a downstream mounting base B2 is pivoted in the Y-Z plane in the installation direction D1 relative to a previously installed upstream mounting base B1 so as to connect the first and second mounting bases B1,B2 together with respect to movement along the X axis to ensure that the respective lateral edges 122,120 of adjacent installed mounting bases B1,B2 are maintained adjacent each other and cannot separated apart from each other along the X axis. When the stud D and slot T of adjacent first and second mounting bases B1,B2 are engaged, the mounting bases B1,B2 are fixed in position relative to each other in all directions except rotation relative to each other in the Y-Z plane. It is not intended that the present development be limited to the shapes of the stud D and slot T disclosed in the illustrated embodiment, and other shapes that achieve the same result can alternatively be used.

Figure 7:
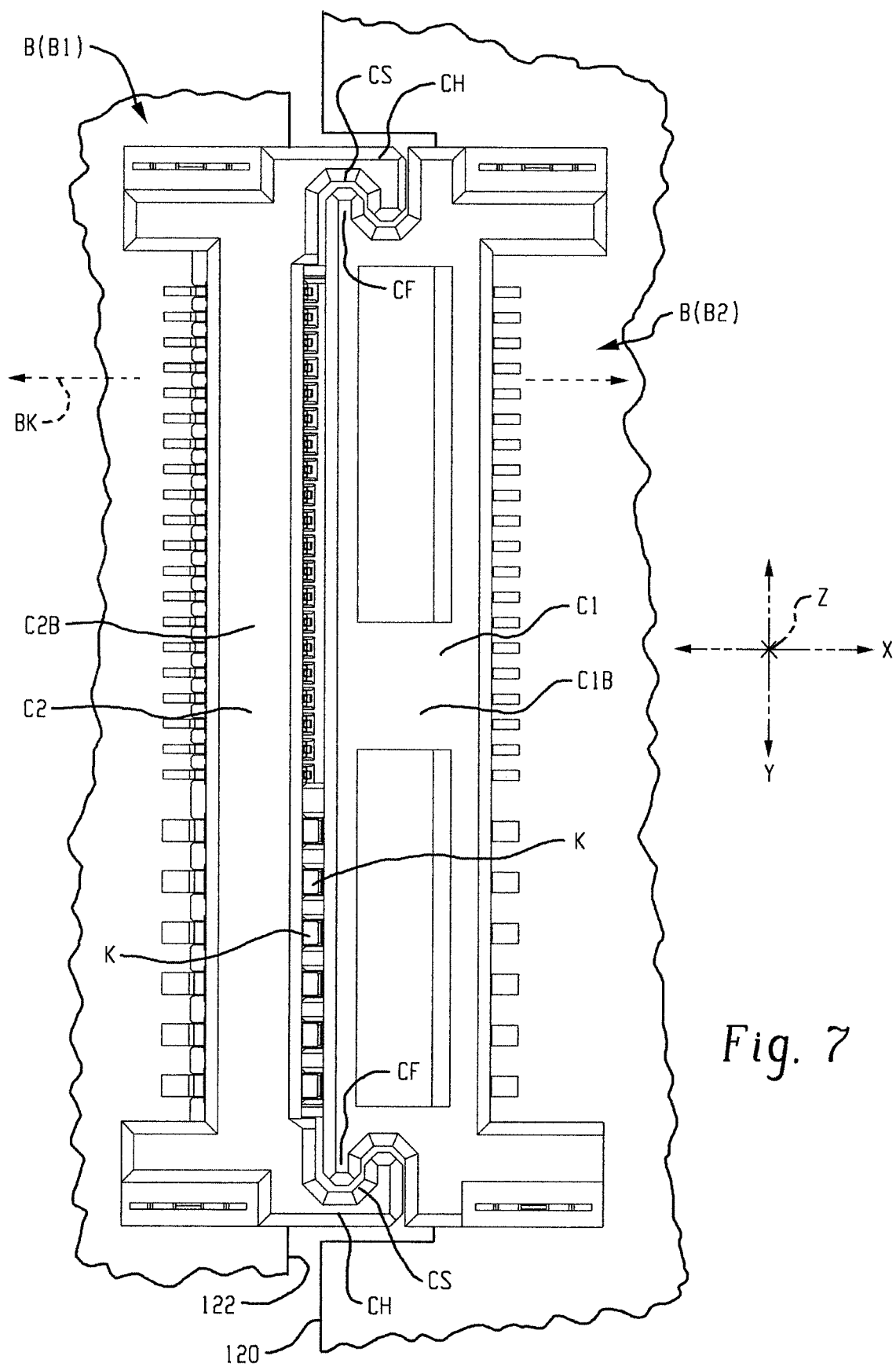
FIG. 7 is a greatly enlarged partial view that shows the first (upstream) backplane connector of the second mounting base of FIG. 6 operatively mated with the second (downstream) backplane connector of the first mounting base of FIG. 6.

As noted above, each mounting base B further includes first and second electrical connectors C1,C2 that physically and electrically connect adjacent upstream and downstream mounting bases B1,B2 together to establish the backplane circuit BK (FIG. 7) that passes through the adjacent mounting bases B operatively interconnected to construct a backplane data/power transmission circuit BK (FIGS. 1 & 7) that travels through the successively interconnected adjacent mounting bases B. FIG. 7 provides a greatly enlarged view that illustrates a first connector C1 of a second (downstream) mounting base B2 physically and electrically mated with the second connector C2 of a first (upstream) mounting base B1. As shown herein, the first connector C1 is located adjacent the first lateral edge 120 of each mounting base B and the second connector C2 is located adjacent the second lateral edge 122 of each mounting base B, but these positions can be reversed in an alternative embodiment. The connectors C1,C2 includes respective electrical contacts K that mate when the first and second connectors C1,C2 are mated as shown in FIG. 7. The first and second connectors C1,C2 are spaced-apart from each other along the X axis and are aligned with each other in terms of their respective positions along the Y axis and the Z axis. The first and second connectors C1,C2 are also aligned with an overlap the Y axis position of the channel recess 130 and are aligned with the fasteners FS in terms of the Y axis position, i.e., the axis of rotation FSX of the fastener(s) FS intersects the channel recess 130 and the Y axis location of the each connector C1,C2 at least partially overlaps or coincides with the Y axis location of the channel recess 130. A reference plane RP (FIG. 2) that lies perpendicular to the Y axis and that includes an axis of rotation FSX of a fastener FS will intersect the channel recess 130, the slot 34 of the first channel 30, and both the first and second connectors C1,C2. The close-fitting receipt of the first channel 30 of the baseplate P into the channel recess 130 and the engagement of the fasteners FS with the first channel 30, in combination with the alignment between the first channel 30, the channel recess 130, the fasteners FS, and the first and second connectors C1,C2 helps to minimize any undesired movement of the first and second connectors C1,C2 relative to the baseplate P and relative to any adjacent connectors mated therewith.

The first and second connectors C1,C2 are shaped and dimensioned such that they can be mated or separated by movement relative to each other in the Y-Z plane when a second downstream mounting base B2 is pivoted relative to an upstream mounting base B1 that has been previously installed on the baseplate P, but the first and second connectors are structured such that they cannot be separated from each other or disengaged by relative movement along either the X axis or the Y axis. When the first and second connectors C1,C2 are operatively mated as shown in FIG. 7, the first and second connectors C1,C2 (and the mounting bases B2,B1 to which they are respectively connected) are fixed in position relative to each other with respect to movement along the X axis and the Y axis.

In general terms, this result is achieved by forming the first and second connectors C1,C2 with corresponding structures that engage each other when the connectors C1,C2 are mated to prevent relative movement between the first and second connectors C1,C2 along the X axis or the Y axis, but that allow relative movement between the first and second connectors C1,C2 along the Z axis and when they are rotated relative to each other in the Y-Z plane. In the illustrated embodiment, this result and these mating structures are obtained by forming one of the first and second connectors (the first connector C1 as shown herein) with at least one and preferably first and second flanges CF that project outwardly from the connector body C1B in opposite directions along the Y axis and by forming the other one of the first and second connectors (the second connector C2 as shown herein) with a corresponding number of connector hooks CH that project outwardly from the connector body CB2 and that are adapted to receive and retain the respective connector flange(s) CF by relative movement of the first and second connectors C1,C2 in the Y-Z plane. When the first and second connectors C1,C2 are mated, each connector flange CF is captured in a slot CS of the connector hook CH such that the first and second connectors C1,C2 can only be disengaged from each other by rotational movement in the Y-Z plane.

In use, a first or upstream mounting base B1 is connected to the baseplate P by first inserting its mounting tab(s) MT into the mounting recess 56 and then pivoting the mounting base B in the installation direction D1 until the first channel 30 of the baseplate P is fully seated in the channel recess 130 of the mounting base B1. The screw or other fastener FS is advanced into the slot 34 of the first channel 30 to secure the mounting base to the baseplate P and optionally to complete the ground path (or this fastener securement step can be delayed until all mounting bases B are installed on a baseplate P). A second or downstream mounting base B2 is installed adjacent the previously installed first or upstream mounting base B1 in the same manner and such that the projecting stud D thereof is received in the slot T of the upstream first mounting base B1 (or vice versa of the locations of the stud D and slot T are reversed) and such that the first connector C1 of the second/downstream mounting base B2 is physically and electrically mated with the second connector C2 of the first/upstream mounting base B1. Once the stud D is engaged in the slot T, the second module B2 is only movable in the Y-Z plane in the first and second rotational directions D1,D2. As noted, the fasteners FS are engaged with the baseplate P to secure the mounting bases B1,B2 to the baseplate and to ensure that each mounting base B1,B2 is electrically grounded to the baseplate P.

The present mounting system S thus provides a structure and method that progressively removes degrees of freedom of movement of each mounting base B as it is installed on the baseplate P, first by fixing the Y axis position when the mounting tab MT is engaged with the mounting hook 50, and next by fixing the X axis position when the stud D is engaged with its corresponding slot T, and finally by fixing the Z axis position when the mounting base is fully engaged with and abutted with the baseplate P. Furthermore, the physical interconnection of the first and second electrical connectors C1,C2 as described above ensures a reliable connection for electrical power and/or data through the contacts K o the connectors C1,C2 to provide a reliable backplane circuit BK.

In the preceding specification, various embodiments have been described with reference to the accompanying drawings. It will, however, be evident that various modifications and changes may be made thereto, and additional embodiments may be implemented, without departing from the broader scope of the invention as set forth in the claim(s) that follow. The specification and drawings are accordingly to be regarded in an illustrative rather than restrictive sense.

The invention claimed is:

1. A baseplate for mounting an associated electronics module, said baseplate comprising:
    a main wall comprising opposite first and second faces;
    opposite left and right ends that are spaced apart from each other along an X axis;
    opposite first and second spaced-apart edges that extend between and interconnect the left and right ends, said first and second edges spaced apart from each other along a Y axis;
    a first channel that projects outwardly relative to the first face of the main wall, said first channel comprising first and second spaced-apart side walls that project outwardly from the main wall and that extend parallel to the X axis such that a first open slot of said first channel is defined between the first and second side walls, said first open slot of said first channel adapted to receive an associated mounting fastener;
    a mounting leg that projects outwardly relative to the first face of the main wall, said mounting leg arranged relative to said first face such that a mounting recess is defined between the mounting leg and the first face, said mounting leg spaced-apart from said first edge of the baseplate;
    wherein said baseplate comprises a one-piece structure; and,
    wherein said first and second side walls of the first channel include respective outer faces that are oriented away from each other, and wherein the outer face of at least one of the first and second side walls includes a rib projecting outwardly therefrom that is adapted to be engaged by the associated electronics module.

2. The baseplate as set forth in claim 1, wherein the outer faces of both the first and second side walls include respective first and second ribs projecting outwardly therefrom that are adapted to be engaged by the associated electronics module.

3. The baseplate as set forth in claim 1, wherein said a mounting leg of said baseplate is located closer to the second edge of said baseplate as compared to the first edge.

4. The baseplate as set forth in claim 3, wherein the first channel is spaced from said mounting leg and is located closer to the first edge of the base plate as compared to the second edge of the base plate.

5. The baseplate as set forth in claim 4, wherein said baseplate comprises a one-piece extruded metallic structure.

6. An electronics module mounting base, said mounting base comprising:
a body comprising at least one mounting tab that projects outwardly therefrom, said mounting tab adapted to be received by an associated baseplate;
said body further comprising a front face adapted to receive and retain an associated electronics module and comprising a rear face that located opposite said front face and that is adapted to lie adjacent the associated baseplate, said rear face of said body including a channel recess located therein that extends between opposite left and right edges of the body, wherein said channel recess is adapted to receive part of the associated baseplate therein;
a first electrical connector located adjacent the left edge of the body;
a second electrical connector located adjacent the right edge of the body;
said first and second electrical connectors aligned with each other and said first and second electrical connectors both aligned with the channel recess.

7. The electronics module mounting base as set forth in claim 6, further comprising at least one fastener that extends through said body and that intersects said channel recess, said at least one fastener adapted to engage the associated baseplate.

8. The electronics module mounting base as set forth in claim 7, wherein:
said left and right edges of said body and said first and second electrical connectors are spaced apart from each other along an X axis;
said first electrical connector, said second electrical connector, and said channel recess are all aligned with each other in terms of their respective positions relative to a Y axis that lies perpendicular to said X axis; and,
said at least one fastener is rotatable about an axis of rotation that is parallel to a Z axis that is oriented perpendicular to both said X axis and said Y axis such that a reference plane oriented perpendicularly with respect to said Y axis and including said axis of rotation intersects the channel recess and both of the first and second connectors.

9. The electronics module mounting base as set forth in claim 7, wherein said module mounting base further comprises a printed circuit board, and wherein said module mounting base further comprises a metal ring coaxially positioned about said at least one fastener adjacent said circuit board to provide an electrical ground path between said printed circuit board and the associated baseplate.

10. The electronics module mounting base as set forth in claim 9, further comprising a resilient clip connected to said body and adapted to engage the associated baseplate.

11. The electronics module mounting base as set forth in claim 9, further comprising first and second resilient clips connected to said body and adapted to engage the associated baseplate.

12. The electronics module mounting base as set forth in claim 11, further comprising a stud projecting outward from one of said left and right edges of the body and a slot located in the other of the left and right edges of the body, wherein the stud is adapted to be engaged with a first associated adjacent module mounting base and the slot is adapted to be engaged by a second associated adjacent module mounting base.

13. The electronics module mounting base as set forth in claim 6, wherein one of the first and second connectors comprises first and second hooks and the other of the first and second connectors comprises first and second flanges.

14. An electronics module mounting system comprising:
a baseplate;
first and second module mounting bases releasably connected to the baseplate, each of said first and second mounting bases comprising:
at least one mounting tab that projects outwardly from the mounting base and engaged with the baseplate;
a front face adapted to receive and retain an associated electronics module;
left and right edges said left and right edges spaced apart from each other along an X axis;
a rear face that is located opposite said front face and that lies adjacent the baseplate, said rear face of said mounting base including a channel recess located therein that extends between opposite left and right edges of the mounting base, wherein a portion of said baseplate is located in said channel recess;
a first electrical connector located adjacent the left edge of the mounting base;
a second electrical connector located adjacent the right edge of the mounting base;
a Y axis position of each of the first and second connectors at least partially overlapping a Y axis position of the channel recess;
a fastener engaged with the mounting base and engaged with the portion of the baseplate located in said channel recess;
wherein the first mounting base includes one of a stud and a slot adjacent the right edge of the first mounting base and the second mounting base includes the other of said stud and said slot adjacent the left edge of the second mounting base, and wherein the stud of said one of the first and second mounting bases is located in the slot of the other of the first and second mounting bases, said stud captured in said slot with respect to movement along said X axis such that said first and second mounting bases are restrained against movement relative to each other along said X axis; and
wherein said first connector of said second mounting base is mechanically and electrically mated with said second connector of said first mounting base such that said mated first and second connectors are restrained against movement relative to each other along both said X axis and said Y axis.

15. The electronics module mounting system as set forth in claim 14, wherein for both of said first and second module mounting bases, said fastener rotates about an axis of rotation that is parallel to a Z axis that lies perpendicular to both said X axis and said Y axis, and wherein said first and second connectors are spaced-apart from each other along said X axis and aligned with each other with respect to said Y axis and said Z axis such that a reference plane that lies perpendicular to the Y axis and that includes said fastener axis of rotation will intersect the channel recess and both the first and second connectors.

16. The electronics module mounting system as set forth in claim 15, wherein one of the first and second connectors comprises first and second hooks and the other of the first and second connectors comprises first and second flanges, and wherein engagement of the first and second hooks with the first and second flanges restrains movement of mated first and second connectors along both the X axis and the Y axis.

17. The electronics module mounting system as set forth in claim 16, wherein said second mounting base is selectively manually movable relative to the first mounting base when said fastener of the second mounting base is disengaged from the baseplate only by pivoting said second mounting base about a pivot axis that extends parallel to said X axis.

* * * * *